United States Patent
Chien

(10) Patent No.: US 11,237,414 B2
(45) Date of Patent: Feb. 1, 2022

(54) DETECTING METHOD AND DETECTING EQUIPMENT THEREFOR

(71) Applicants: HKC Corporation Limited, Shenzhen (CN); Chongqing HKC Optoelectronics Technology Co., ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 1079 days.

(21) Appl. No.: 15/847,363

(22) Filed: Dec. 19, 2017

(65) Prior Publication Data

US 2018/0157067 A1  Jun. 7, 2018

Related U.S. Application Data

(63) Continuation of application No. PCT/CN2017/086265, filed on May 27, 2017.

(30) Foreign Application Priority Data

Dec. 6, 2016 (CN) .......................... 201611108938.0

(51) Int. Cl.
| | |
|---|---|
| *G02F 1/13* | (2006.01) |
| *H01J 37/22* | (2006.01) |
| *H01J 37/28* | (2006.01) |
| *H01J 37/31* | (2006.01) |
| *H01J 37/30* | (2006.01) |

(Continued)

(52) U.S. Cl.
CPC ........ *G02F 1/1309* (2013.01); *C23C 16/0227* (2013.01); *C23C 16/0272* (2013.01); *C23C 16/483* (2013.01); *H01J 37/222* (2013.01); *H01J 37/28* (2013.01); *H01J 37/3005* (2013.01); *H01J 37/31* (2013.01); *G02F 1/1368* (2013.01); *G02F 1/133351* (2013.01); *H01J 2237/032* (2013.01); *H01J 2237/221* (2013.01); *H01J 2237/24592* (2013.01); *H01J 2237/28* (2013.01); *H01J 2237/2801* (2013.01); *H01J 2237/2813* (2013.01); *H01J 2237/317* (2013.01); *H01J 2237/31749* (2013.01)

(58) Field of Classification Search
CPC .................................................... G02F 1/1309
See application file for complete search history.

(56) References Cited

FOREIGN PATENT DOCUMENTS

CN 102253506 A * 11/2011

* cited by examiner

*Primary Examiner* — Joseph L Williams
(74) *Attorney, Agent, or Firm* — WPAT, PC

(57) ABSTRACT

A detecting method and a detecting equipment therefor are provided. The detecting method includes: inspecting whether a display panel has a defective position; after acquiring the defective position of the display panel by the inspecting, using a first focused ion beam generated by a first ion overhaul apparatus to cut the defective position of the display panel, so as to strip a defect at the defective position and observe morphology of defect; using a repair apparatus to perform a repair treatment on the defective position after the defect is stripped. An inspection apparatus for the inspecting of the defective position, the first ion overhaul apparatus and the repair apparatus are sequentially installed on the same production line.

18 Claims, 3 Drawing Sheets

(51) Int. Cl.
  *C23C 16/02* (2006.01)
  *C23C 16/48* (2006.01)
  *G02F 1/1368* (2006.01)
  *G02F 1/1333* (2006.01)

DETECTING METHOD AND DETECTING EQUIPMENT THEREFOR

FIELD OF THE DISCLOSURE

The disclosure relates to the field of liquid crystal equipment production and research technology, and more particularly to a detecting method and a detecting equipment therefor.

BACKGROUND

In current technology of related art, liquid crystal display manufacturers use a method of cutting into small pieces to carry out FIB (Focused Ion Beam) analysis on the display panel, and in a process of manufacturing a TFT-LCD (thin film transistor liquid crystal display) panel, if there is a possible defect on a glass panel of the display panel, the glass panel must be cut into small pieces for FIB analysis. In this way, it is inevitable to waste the whole glass panel, resulting in a waste of display panel manufacturing materials as well as a waste of production cost.

SUMMARY

An objective of the disclosure is to provide a detecting method and a detecting equipment therefor, so as to solve the problem of waste of the whole glass panel resulting from the FIB analysis in the display panel production process of the current technology.

In order to solve the above technical problem, a technical solution proposed by this disclosure is to provide a detecting method. The detecting method includes following steps of:

inspecting whether a display panel has a defective position;

after acquiring the defective position of the display panel by the inspecting, using a first focused ion beam generated by a first ion overhaul apparatus to cut the defective position of the display panel, so as to strip a defect at the defective position and observe morphology of defect;

using a repair apparatus to perform a repair treatment on the defective position after the defect is stripped;

wherein an inspection apparatus for the inspecting of the defective position, the first ion overhaul apparatus and the repair apparatus are sequentially installed on the same production line.

In an embodiment, the inspection apparatus is an optical inspection machine, the optical inspection machine uses an optical camera to scan the whole display panel for image capturing and compares data of a captured image with qualified parameters stored in a database of the optical inspection machine, to determine the defective position of the display panel and observe morphology of defect.

In an embodiment, the inspection apparatus is a second ion overhaul apparatus, a second focused ion beam generated by the second ion overhaul apparatus is used to scan the display panel for imaging, to determine the defective position of the display panel and observe morphology of defect.

In an embodiment, in a process of stripping the defect at the defective position, a scanning electron microscope simultaneously is used to observe the defective position being stripped, to judge whether a result of the stripping meets a subsequent repair requirement in real-time.

In an embodiment, in a process of using the repair apparatus to perform a repair treatment on the defective position after the defect is stripped, a scanning electron microscope is used to observe the defective position being repaired, to monitor the process of the repair treatment on the defective position of the display panel in real-time.

In an embodiment, a scanning electron microscope is movably installed between the first ion overhaul apparatus and the repair apparatus; in the process of stripping the defect at the defective position, the scanning electron microscope is moved to be abreast with the first ion overhaul apparatus; and in the process of using the repair apparatus to perform a repair treatment on the defective position after the defect is stripped, the scanning electron microscope is moved to be abreast with the repair apparatus.

In an embodiment, two scanning electron microscopes are used; one of the two scanning electron microscopes is used to observe the defective position being stripped in the process of stripping the defect at the defective position, and the one scanning electron microscope is abreast and fixed with the first ion overhaul apparatus; the other one of the two scanning electron microscopes is used to observe the defective position being repaired in the process of performing the repair treatment on the defective position, and the other one scanning electron microscope is abreast and fixed with the repair apparatus.

In an embodiment, before inspecting whether a display panel has a defective position, performing a thin film coating treatment on the display panel to obtain a thin film coating layer; wherein the defect at the defective position is a defect of the thin film coating layer.

In an embodiment, the thin film coating layer is formed by one or multiple coating processes selected from a vacuum evaporation coating process, a sputtering coating process, a plasma coating process and an ion coating process.

In an embodiment, after using a repair apparatus to perform a repair treatment on the defective position after the defect is stripped, performing a subsequent photolithography process on the display panel.

In an embodiment, after using a repair apparatus to perform a repair treatment on the defective position after the defect is stripped but before performing a subsequent photolithography process on the display panel, performing an examination of repair quality on the repaired display panel and judging whether the repair quality of the display panel is qualified; performing the subsequent photolithography process on the display panel with qualified repair quality, performing a repair treatment rework on the display panel with unqualified repair quality, or discarding the display panel with unqualified repair quality.

According to another aspect of the disclosure, a detecting equipment is provided. The detecting equipment includes: an inspection apparatus, configured to inspect a defective position of a display panel; a first ion overhaul apparatus, configured to cut the defective position of the display panel; and a repair apparatus, configured to repair the cut defective position of the display panel. The inspection apparatus, the first ion overhaul apparatus and the repair apparatus are sequentially installed on a same production line.

In an embodiment, the inspection apparatus is an optical inspection machine, or the inspection apparatus is a second ion overhaul apparatus.

In an embodiment, the detecting equipment further includes a scanning electron microscope, the scanning electron microscope is configured to observe a process of stripping a defect at the defective position of the display panel, and the scanning electron microscope is juxtaposed with the first ion overhaul apparatus.

In an embodiment, the detecting equipment further includes a scanning electron microscope, and the scanning electron microscope is movably disposed between the first ion overhaul apparatus and the repair apparatus.

In an embodiment, the detecting equipment further includes two scanning electron microscopes, one of the two scanning electron microscopes is juxtaposed and fixed with the first ion overhaul apparatus, and the other one of the two scanning electron microscopes is juxtaposed and fixed with the repair apparatus.

In an embodiment, the detecting equipment further includes a thin film coating apparatus, and the thin film coating apparatus is disposed at an upstream position of the inspection apparatus.

In an embodiment, the detecting equipment further includes a repair quality examination apparatus, the repair quality examination apparatus is configured to perform an examination of repair quality on the display panel after the cut defective position is repaired, and the repair quality examination apparatus is disposed a downstream position of the repair apparatus.

In an embodiment, the repair quality examination apparatus is a third ion overhaul apparatus.

By adopting the detecting method proposed by the disclosure, it can retain the whole glass panel with a defective position of the display panel and can repair the defective position on the glass panel, so that the whole glass panel of the display panel can be repaired to be a glass panel product satisfying the product quality requirement, the waste (scrap) rate of glass panel is reduced and the production cost is saved.

DETAILED DESCRIPTION OF EMBODIMENTS

In order to make the objectives, technical solutions and advantages of the disclosure more clear and comprehensible, the disclosure will be further described in detail below with reference to accompanying drawings and embodiments. It should be understood that, the specific embodiment described herein are merely for illustrating the disclosure rather than limiting the disclosure.

It should be noted that, when an element is referred to as "fixed on" or "disposed on" another element, it may be directly on the other element or indirectly on the other element. When an element is referred to as "connected to" another element, it may be directly connected to the other element or indirectly connected to the other element.

It should also be noted that, orientation terms such as "left", "right", "up", "down" used in the embodiments only are mutually relative concepts or referred to a normal use state of product and thus should not be considered as restrictive.

Figure 1:
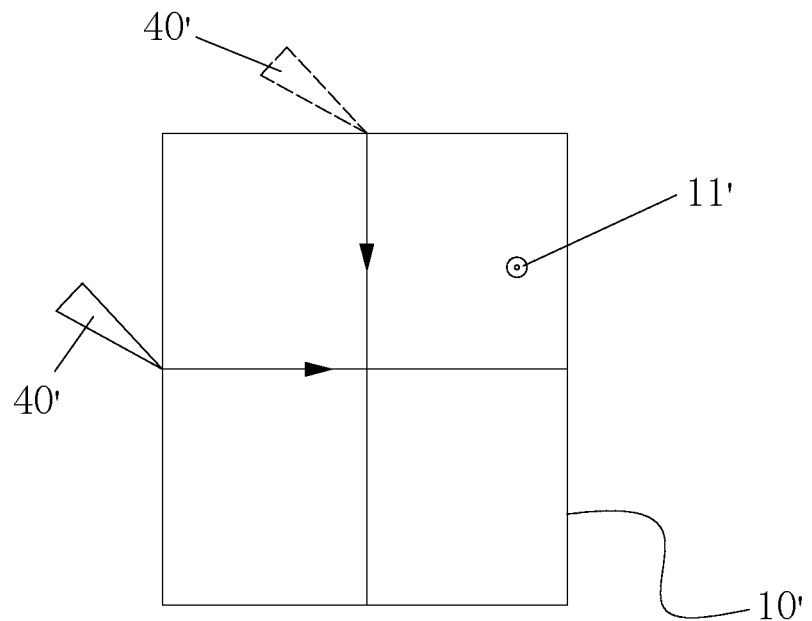
FIG. 1 is a schematic structural view of a display panel being cut into small pieces before a FIB analysis in current technology of related art.
Figure 2:
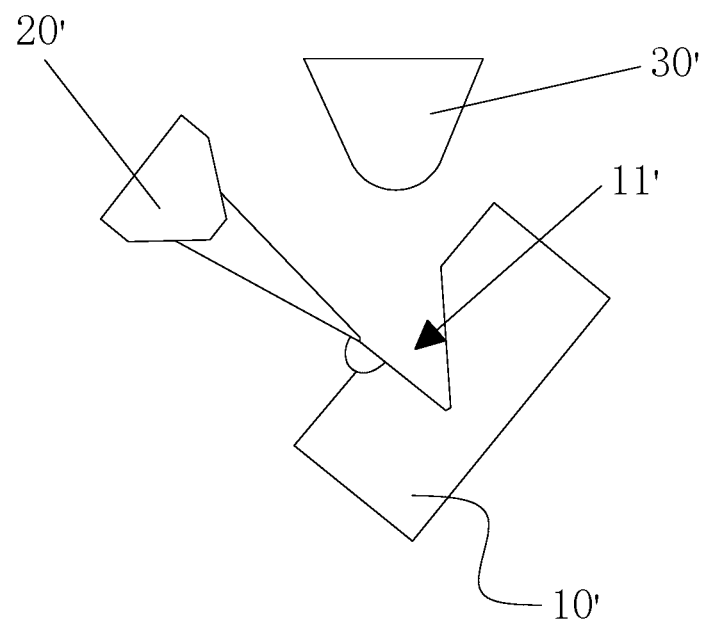
FIG. 2 a schematic structural view of a small piece of display panel being performed with a FIB analysis in current technology of related art.
Figure 3:
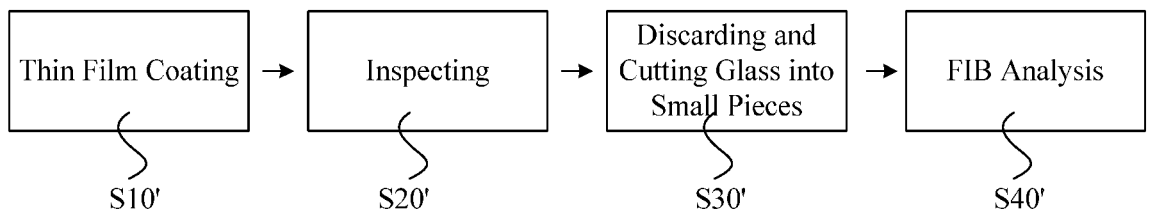
FIG. 3 is a flowchart of performing a FIB analysis in current technology of related art.

Referring to FIG. 3, a thin film coating operation is performed on a glass panel 10' of a display panel (e.g., TFT-LCD panel) to form a thin film coating layer, i.e., step S10'. Then, the thin film coating layer is inspected to determine whether there is a defect on the glass panel 1o', i.e., step S20', if it is inspected that there is a defect on the glass panel 10', a specific position of the defect on the glass panel 10' will be determined. Next, as shown in FIG. 1, a cutting tool 40' is used to cut the whole glass panel 10' into small pieces (the black arrow directions in FIG. 1 are cutting directions), i.e., step S30', a small piece of glass panel with a defective position 11' then is obtained for a FIB analysis using a FIB equipment 20' and meanwhile a scanning electron microscope 30' is used for observing a result of the FIB analysis, i.e., step 40', as shown in FIG. 2. Because in current technology of related art, machine equipments for performing various operations on the glass panel 10' respectively are distributed in different installation positions, it is necessary to cut the glass panel 10' into small pieces so as to perform the FIB analysis, otherwise if the whole glass panel 10' is carried back and forth, which not only would increase workload of staff, but also easily cause physical injury of the staff because of the glass panel 10' being fragile dangerous goods. Such architecture leads to the necessity of cutting the glass panel 10' for the FIB analysis, resulting in a waste of the glass panel 10'.

In order to avoid the waste and discard of the glass panel 10 and at the same time do not increase the workload of staff and ensure the safety of the staff, the disclosure provides a detecting method.

Figure 4:
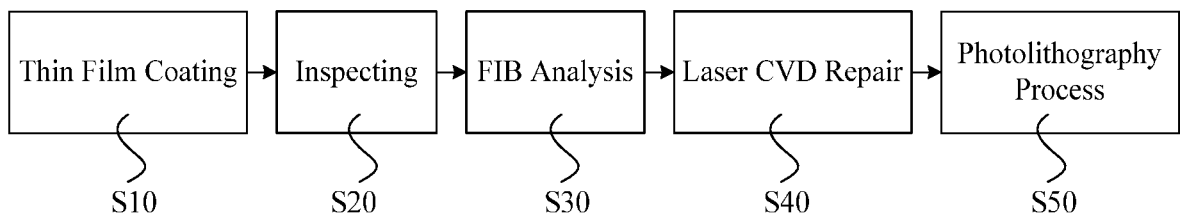
FIG. 4 is a flowchart of an embodiment of a detecting method according to the disclosure.
Figure 5:
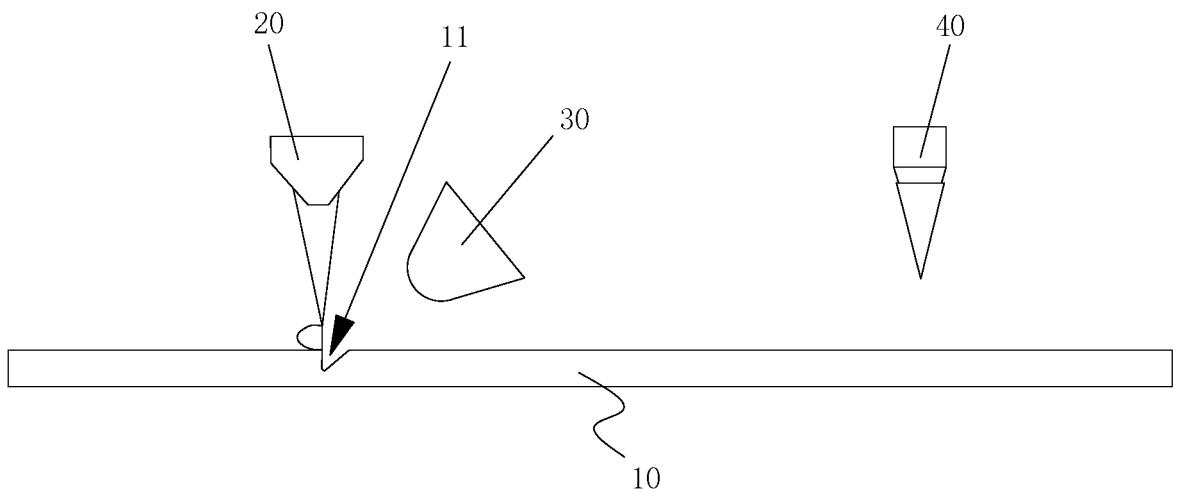
FIG. 5 is a schematic structural view of performing a FIB analysis according to the disclosure.
Figure 6:
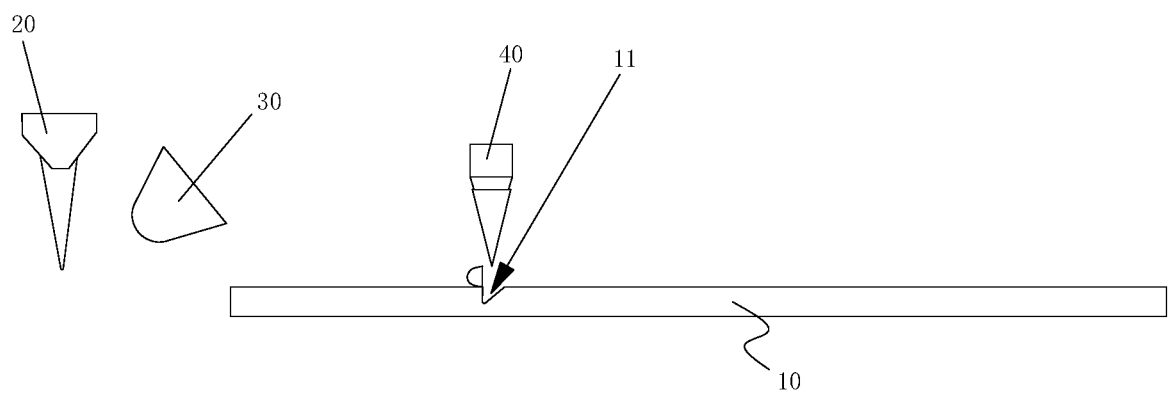
FIG. 6 is a schematic structural view of performing a repair treatment according to the disclosure.

Referring to FIG. 4 through FIG. 6, the detecting method includes following steps:

inspecting whether a whole glass panel 10 of a display panel has a defective position 11;

after acquiring the defective position 11 on the whole glass panel 10 by the inspecting, using a first ion overhaul apparatus 20, e.g., a first FIB apparatus, and concretely using a first focused ion beam generated by the first FIB apparatus to cut the defective position 11 on the glass panel 10, to strip a defect at the defective position 11 and observe morphology of defect;

and afterwards, using a repair apparatus 40, e.g., a laser CVD repair apparatus (See explanatory note ②), to perform a repair treatment onto the defective position 11 after the defect is stripped.

The inspection apparatus for the inspecting of the defective position, the first FIB apparatus and the laser CVD repair apparatus are sequentially installed on the same production line of inspection and repair.

The inspection apparatus, the first FIB apparatus and the laser CVD repair apparatus are sequentially installed on the same production line of inspection and repair, the defective position 11 on the whole glass panel 10 then is inspected and determined, and after the defective position 11 is determined, because the glass panel 10 can be immediately delivered to next procedure on the same production line of inspection and repair, it is conveniently to perform the FIB analysis and cutting on the defective position 11 on the whole glass panel 10 and observe morphology of defect; and subsequently the whole glass panel 10 is delivered to a repair procedure of the laser CVD repair apparatus for repair treatment. Accordingly, by adopting the technical solution of the disclosure, it can retain the whole glass panel 10 with the defective position 11 and repair the defective position 11 on the glass panel 10, so that the whole glass panel 10 can be repaired to be a glass panel product meeting the product quality requirement, the scrap (waste) rate of glass panel can be reduced, the production cost is saved, and in the whole production process, the staff does not need to carry or contact the glass panel 10, and therefore it can protect physical safety of the staff without increasing the workload of the staff.

As shown in FIG. 4, before inspecting whether the whole glass panel 10 of the display panel has a defective position 11, the step S10 firstly is carried out, i.e., performing a thin film coating treatment onto the whole glass panel 10 of the display panel to obtain a thin film coating layer. The defect at the defective position 11 is a defect of the thin film coating layer. That is, the FIB analysis and the laser CVD repair are for analyzing and repairing the defect of the thin film coating layer. In the disclosure, one coating process selected from a vacuum evaporation coating process, a sputtering coating process, a plasma coating process and an ion coating process is used to form the thin film coating layer, or multiple (i.e., more than one) coating processes selected from the vacuum evaporation coating process, the sputtering coating process, the plasma coating process and the ion coating process are combined to form the thin film coating layer.

As shown in FIG. 4, in the process of inspecting the defective position 11 on the glass panel 10, the inspection apparatus used in the detecting method of the disclosure is an optical detection machine and exemplarily is the current sophisticated and mature AOI machine (see explanatory note ③). That is, the AOI machine is used to carry out the inspection operation in the step S20. In particular, the AOI machine uses an optical camera to scan the whole glass panel 10 to capture an image and compares it with qualified parameters stored in a database of the AOI machine, so as to determine the defective position 11 on the glass panel 10 and observe morphology of defect. The defective position 11 which may appear on the glass panel 10 is photographed for inspection based on an optical detection principle, so that the inspection result can be visually and clearly displayed.

Or in the step S20 as shown in FIG. 4, the inspection apparatus used in the detecting method of the disclosure is a second ion overhaul apparatus, e.g., a second FIB apparatus. In particular, a second focused ion beam generated by the second FIB apparatus is used to scan the glass panel 10 of the display panel for imaging, so as to determine the defective position 11 on the glass panel 10 and observe morphology of defect. The principle of using the second FIB apparatus to scan for imaging can refer to the explanatory note ①.

In order to prevent the glass panel 10 from being excessively stripped during using the focused ion beam generated by the first FIB apparatus to strip the defect at the defective position 11 on the glass panel 10, in the process of stripping the defect at the defective position, i.e., in the process of carrying out the step S30 as shown in FIG. 4 onto the defective position on the glass panel 10, a scanning electron microscopy simultaneously is used to observe the defective position being stripped, so as to judge whether the stripping result meets the requirement for subsequent laser CVD repair (at this time, the scanning electron microscopy only is used to monitor the stripping process, and the scanning electron microscope is juxtaposed and fixed with the first FIB apparatus).

When the stripping degree at the defective position 11 on the glass panel 10 has met the requirement of the laser CVD repair, the first FIB apparatus is stopped working, the glass panel 10 then is delivered to the work station of next repair procedure and the laser CVD repair apparatus is used to repair the stripped defective position 11, so as to make the repaired glass panel 10 meet quality requirement of glass panel product, i.e., completing the laser CVD repair operation of step S40 as shown in FIG. 4. In the process of repairing the defective position of the display panel, it is also necessary to monitor the repairing process of the defective position in real-time, so as to monitor the repair operation of the defective position of the display panel in real-time and prevent the display panel from being discarded caused by misoperation in the process of repairing the defective position. Therefore, a scanning electron microscope is employed to monitor the defective position of the display panel in real-time during the repairing process, the scanning electron microscope used in the repairing process for real-time monitoring and the scanning electron microscope used in the stripping process for real-time monitoring are the same microscope, and at this situation the scanning electron microscope is movably installed between the first ion overhaul apparatus 20 and the repair apparatus 40. When performing the stripping operation onto the defective position of the display panel, the scanning electron microscope is moved to be juxtaposed with and near the first ion overhaul apparatus 20 so as to realize the real-time monitoring to the whole stripping process; and when performing the repairing operation onto the defective position of the display panel, the scanning electron microscope is moved to be juxtaposed with and near the repair apparatus 40 so as to monitor the repairing process in real-time.

In another embodiment, in order to increase production efficiency, two scanning electron microscopes are provided. One scanning electron microscope is used in the process of stripping the defective position of the display panel for real-time monitoring the stripping operation, and the scanning electron microscope is abreast and fixed with the first ion overhaul apparatus 20. The other one scanning electron microscope is used for real-time monitoring the repairing operation in the process of repairing the defective position of the display panel, and the other one scanning electron microscope is abreast and fixed with the repair apparatus. Such that, it can solve the problem of waiting in the case of only one scanning electron microscope being equipped to sequentially monitor the stripping operation and the repairing operation, and consequently each work station has a relative independence.

In the disclosure, after using the repair apparatus to perform a repair treatment on the defective position after the defect is stripped and before performing a subsequent photolithography process on the display panel, the repair quality of the repaired display panel is examined and whether the repair quality of the display panel is qualified or not is judged. The repaired display panel with qualified repair quality will be carried out with the subsequent photolithography process, while the repaired display panel with unqualified repair quality is performed with a repair treatment rework or discarded. Such that, the quality of the display panel going into the subsequent photolithography fully meets the product qualification requirement, and therefore it can make sure that the quality of the display panel which is manufactured and finally shipped meets the quality requirement.

Specifically, after completing the repair treatment on the defective position of which the defect is stripped by using the laser CVD repair apparatus, the display panel then is performed with the subsequent photolithography process (the implementation of the photolithography is the same as that of the conventional photolithography in the art, and thus will not be repeated herein), i.e., step S50 as shown in FIG. 4 is carried out, so as to continue to complete the production process of the display panel.

According to another aspect of the disclosure, a detecting equipment is provided, as shown in FIG. 5 and FIG. 6. The detecting equipment is applied to the above-described detecting method, to inspect and repair the defect on the glass panel 10 of a display panel. The detecting equipment includes an inspection apparatus, a first ion overhaul apparatus 20 (e.g., a first FIB apparatus, see the explanatory note ①) and a repair apparatus 40 (e.g., a laser CVD repair apparatus). The inspection apparatus is configured (i.e., structured and arranged) to inspect a defective position 11 on the glass panel 10 of a display panel. The first FIB apparatus is configured to cut the defective position of the display panel. The laser CVD repair apparatus is configured to repair the defective position 11 of the display panel after being cut. The inspection apparatus, the first FIB apparatus and the laser CVD repair apparatus are sequentially installed on the same production line in that order.

In particular, the inspection apparatus, the first ion overhaul apparatus 20 (e.g., the first FIB apparatus) and the repair apparatus (e.g., the laser CVD repair apparatus) are sequentially installed on the same production line of inspection and repair in that order, the whole glass panel 10 then is performed with an inspection and determination of the defective position 11, after the defective position 11 is determined, because the glass panel 10 can be immediately delivered to the next procedure of the same production line of inspection and repair, it is conveniently to perform a FIB analysis, cutting to the defective position 11 on the whole glass panel 10 and observe morphology of defect, and afterward the whole glass panel 10 is delivered to a repair work station of the laser CVD repair apparatus for a repair treatment.

In the illustrated embodiment, the inspection apparatus may be the current universal AOI machine (which is an optical inspection machine), the AOI machine uses an optical camera to scan the whole glass panel 10 for image capturing and compares data of the captured image with qualified parameters stored in a database of the AOI machine to determine the defective position 11 on the glass panel 10 and observe morphology of defect. The defective position 11 which may appear on the glass panel 10 is photographed and inspected based on the optical detection principle, so that the inspection result can be visually and clearly displayed.

Or, the inspection apparatus may be a second ion overhaul apparatus (e.g., a second FIB apparatus, see the explanatory note ①) instead, and the second FIB apparatus is used to scan for imaging.

Moreover, the detecting equipment includes a scanning electron microscope for observing a stripping process of the defective position of the display panel, the scanning electron microscope is juxtaposed with the first ion overhaul apparatus 20 (e.g., the first FIB apparatus), and furthermore the scanning electron microscope in this situation is abreast and fixed with the first ion overhaul apparatus 20, i.e., the relative position between the first ion overhaul apparatus 20 and the scanning electron microscope is fixed, and thus the scanning electron microscope is only for real-time monitoring the stripping process. In the process of stripping the defect at the defective position, the scanning electron microscope simultaneously is used to observe the defective position being stripped, so as to acquire the stripping result whether meets the requirement of subsequent laser CVD repair or not in real-time.

Or, in another embodiment, the scanning electron microscope of the detecting equipment is movably disposed between the first ion overhaul apparatus 20 and the repair apparatus 40. At this situation, the scanning electron microscope can be used to perform simultaneous real-time monitoring to the stripping process and the repairing process of the same display panel as per the order of working procedures, that is, when performing a stripping operation at the defective position of the display panel, the scanning electron microscope is moved to be abreast with and near the first ion overhaul apparatus 20 and for real-time monitoring the whole stripping process, and when performing a repairing operation at the defective position of the display panel, the scanning electron microscope is moved to be abreast with and near the repair apparatus 40 and for real-time monitoring the whole repairing process.

Or, in still another embodiment, the detecting equipment is equipped with two scanning electron microscopes. One of the scanning electron microscopes is abreast and fixed with the first ion overhaul apparatus 20 (i.e., the relative position between the first ion overhaul apparatus 20 and the scanning electron microscope is fixed), and the scanning electron microscope is only for real-time monitoring the stripping operation of the defective position of the display panel carried out by the first ion overhaul apparatus 20; the other of the scanning electron microscopes is abreast and fixed with the repair apparatus 40 (i.e., the relative position between the repair apparatus 40 and the other scanning electron microscope is fixed), and the scanning electron microscope is only for real-time monitoring the repairing operation onto the defective position of the display panel carried out by the repair apparatus 40.

In order to highlight the defective position 11 on the glass panel 10 of the display panel, the detecting equipment further includes a thin film coating apparatus. The thin film coating apparatus is arranged at an upstream position of the inspection apparatus. The thin film coating apparatus may be an apparatus for carrying out one coating process selected from a vacuum evaporation coating process, a sputtering coating process, a plasma coating process and an ion coating process, or the thin film coating apparatus may be an equipment for carrying out multiple coating processes selected from the vacuum evaporation coating process, the sputtering coating process, the plasma coating process and the ion coating process. By coating a film on the glass panel 10 before inspecting by the inspection apparatus, the defective position 11 can be more clearly exhibited, so that it is more easily to inspect the defective position 11 during the inspection process and thus can prevent the occurrence of failed inspection and fault inspection.

After the display panel is repaired, the display panel is necessarily delivered to subsequent photolithography apparatus and then performed with a corresponding photolithography process. In order to ensure the repaired display panel which will go into the procedure of photolithography process meets the repair quality requirement, the detecting equipment further includes a repair quality examination apparatus for examining the repair quality of the display panel of which the defective position is repaired after cutting. The repair quality examination apparatus is arranged at a downstream position of the repair apparatus 40 but at an upstream position of the subsequent photolithography apparatus, i.e., the repair quality examination apparatus is located at a position between the repair apparatus 40 and the subsequent photolithography apparatus. Preferably, the repair quality examination apparatus is a third ion overhaul apparatus, e.g., a third FIB apparatus (see the explanatory note ①)

Explanatory Notes:

① FIB: Focused Ion Beam, which is that an ion beam generated by a liquid metal gallium (Ga) ion source is accelerated by an ion gun, and then is focused for irradiating on a sample surface to produce a secondary electronic signal and thereby obtain an electronic image, and such function is similar to that of a SEM (scanning electron microscope); or using a strong current ion beam to strip surface atoms so as to complete a micro-scale or nano-scale surface morphology processing, and usually selectively stripping metal, silicon oxide layer or depositing a metal layer by a physical sputtering in collaboration with a chemical gas reaction.

② Laser CVD: Laser chemical vapor deposition, a reaction thereof is a chemical vapor deposition process excited by laser.

③ AOI: Automatic Optic Inspection, which is an equipment for inspecting and positioning a defect of a to-be-detected device based on an optical principle. When performing an automatic inspection, the AOI machine uses a camera to automatically scan the to-be-detected device, capture an image, compare the captured image data with qualified parameters stored in a database, determine a defective position by image processing, and display or mark the defective position by a monitor or an automatic mark respectively for subsequent repair by maintenance personnel.

④ Vacuum evaporation: in a vacuum environment, a material is heated and plated onto a substrate, it is called as vacuum evaporation, the metal is heated to an evaporation temperature, and then the vapor is transferred from the vacuum chamber and condensed on low temperature parts, because such process is carried out in a vacuum and thus the metal vapor can reach the surface without oxidization.

⑤ Sputtering coating: the sputtering coating is that under a vacuum condition, particles with obtained power are used to bombard a surface of a target material to make atoms at the surface of the target material obtain sufficient energy and then escape, the process is called as sputtering. The sputtered target material is deposited onto a surface of a substrate and thus is called as sputtering coating. The incident ions in the sputtering coating are generally obtained by glow discharge. Therefore, the sputtered particles in the process of flying toward the substrate would easily collide with gas molecules in the vacuum chamber, so that their moving directions are random and the deposited film is easy to be uniform. The developed scale magnetron sputtering coating has high deposition rate and good process repeatability.

⑥ Plasma coating: this refers to cold cathode arc evaporation usually used in the PVD field, a solid plating material is used as a cathode, water cooling is used, and a surface of the cold cathode is formed with many bright spots, i.e., cathode arc spots. The arc spot is the arc root of the arc in the vicinity of the cathode. A current density in a very small space is extremely high, the size of the arc spot is very small, it is about 1 μm~100 μm, and the current density is up to 105 A/cm$^2$~107 A/cm$^2$. Each arc spot has a very short existing time, explosively evaporates and ionizes the plating material of the cathode, the evaporated and ionized metal ions would produce new arc spots, many arc spots continuously produce and disappear and therefore it also is known as multi-arc evaporation. The earliest design of the plasma accelerator type multi-arc evaporation ionization source is that a magnetic field is disposed behind the cathode, the evaporated ions would obtain Hall acceleration effect and it is beneficial for the ions to increase energy bombardment volume, when this arc evaporation ionization source is used to perform a coating, the ionization rate is high, so also is known as arc plasma coating.

⑦ Ion coating: it also is known as ion plating, which uses a certain method (such as electron beam evaporation magnetron sputtering, or multi-arc evaporation ionizing, etc.) to make neutral particles be ionized into ions and electrons, a substrate must be applied with a negative bias to facilitate the ions to bombard the substrate, and after appropriately reducing the negative bias, the ions are deposited onto the substrate to form a film. Advantages of the ion plating are as follows: (1) adhesion between the film and the substrate is strong, (2) the film is uniform and dense, (3) the platability is good under the negative bias, (4) no pollution, and (5) a variety of substrate materials are suitable for the ion plating.

The foregoing contents merely are preferred embodiments of the disclosure and not intended to limit the disclosure. Any modifications, equivalent substitutions and improvements within the spirit and principles of the disclosure should be included within the scope of protection of the disclosure.

What is claimed is:

1. A detecting method, comprising:
   inspecting whether a whole glass panel of a display panel has a defective position;
   after acquiring the defective position of the whole glass panel of the display panel by the inspecting, using a first focused ion beam generated by a first ion overhaul apparatus to cut the defective position of the whole glass panel of the display panel, so as to strip a defect at the defective position and observe morphology of defect; and
   using a repair apparatus to perform a repair treatment on the defective position to repair the whole glass panel after the defect is stripped;
   wherein an inspection apparatus for the inspecting of the defective position, the first ion overhaul apparatus and the repair apparatus are sequentially installed on a same production line in that order;
   wherein before inspecting whether the whole display panel has the defective position, the detecting method further comprises: performing a thin film coating treatment on the whole glass panel of the display panel to obtain a thin film coating layer for highlighting the defective position of the whole glass panel of the display panel;
   wherein the defect at the defective position is a defect of the thin film coating layer.

2. The detecting method as claimed in claim 1, wherein the inspection apparatus is an optical inspection machine, the optical inspection machine uses an optical camera to scan the whole glass panel of the display panel for image capturing and compares data of a captured image with qualified parameters stored in a database of the optical inspection machine, to determine the defective position of the whole glass panel of the display panel and observe morphology of defect.

3. The detecting method as claimed in claim 1, wherein the inspection apparatus is a second ion overhaul apparatus, a second focused ion beam generated by the second ion overhaul apparatus is used to scan the display panel for imaging, to determine the defective position of the whole glass panel of the display panel and observe morphology of defect.

4. The detecting method as claimed in claim 1, wherein in a process of stripping the defect at the defective position, a scanning electron microscope simultaneously is used to observe the defective position being stripped, to judge whether a result of the stripping meets a subsequent repair requirement in real-time.

5. The detecting method as claimed in claim 4, wherein in a process of using the repair apparatus to perform a repair treatment on the defective position after the defect is stripped, the scanning electron microscope is used to observe the defective position being repaired, to monitor the process of the repair treatment on the defective position of the whole glass panel of the display panel in real-time.

6. The detecting method as claimed in claim 5, wherein the scanning electron microscope is movably installed between the first ion overhaul apparatus and the repair apparatus; in the process of stripping the defect at the defective position, the scanning electron microscope is moved to be abreast with the first ion overhaul apparatus; and in the process of using the repair apparatus to perform a repair treatment on the defective position after the defect is stripped, the scanning electron microscope is moved to be abreast with the repair apparatus.

7. The detecting method as claimed in claim 5, wherein two scanning electron microscopes are used; one of the two scanning electron microscopes is used to observe the defective position being stripped in the process of stripping the defect at the defective position, and the one scanning electron microscope is abreast and fixed with the first ion overhaul apparatus; the other one of the two scanning electron microscopes is used to observe the defective position being repaired in the process of performing the repair treatment on the defective position, and the other one scanning electron microscope is abreast and fixed with the repair apparatus.

8. The detecting method as claimed in claim 1, wherein the thin film coating layer is formed by one or multiple coating processes selected from a vacuum evaporation coating process, a sputtering coating process, a plasma coating process and an ion coating process.

9. The detecting method as claimed in claim 1, comprising: after using a repair apparatus to perform a repair treatment on the defective position after the defect is stripped, performing a subsequent photolithography process on the display panel.

10. The detecting method as claimed in claim 9, comprising: after using a repair apparatus to perform a repair treatment on the defective position after the defect is stripped but before performing a subsequent photolithography process on the display panel, performing an examination of repair quality on the repaired whole glass panel of the display panel and judging whether the repair quality of the whole glass panel of the display panel is qualified; performing the subsequent photolithography process on the display panel with qualified repair quality, performing a repair treatment rework on the display panel with unqualified repair quality, or discarding the display panel with unqualified repair quality.

11. A detecting equipment, comprising:
an inspection apparatus, configured to inspect a defective position of a whole glass panel of a display panel;
a first ion overhaul apparatus, configured to cut the defective position of the whole glass panel of the display panel;
a repair apparatus, configured to repair the cut defective position of the whole glass panel of the display panel;
wherein the inspection apparatus, the first ion overhaul apparatus and the repair apparatus are sequentially installed on a same production line in that order;
wherein the detecting equipment further comprises a thin film coating apparatus, and the thin film coating apparatus is disposed at an upstream position of the inspection apparatus, wherein the thin film coating apparatus is configured to perform a thin film coating treatment on the whole glass panel of the display panel to obtain a thin film coating layer for highlighting the defective position of the whole glass panel of the display panel;
wherein the defect at the defective position is a defect of the thin film coating layer.

12. The detecting equipment as claimed in claim 11, wherein the inspection apparatus is an optical inspection machine, or the inspection apparatus is a second ion overhaul apparatus.

13. The detecting equipment as claimed in claim 11, wherein the detecting equipment further comprises a scanning electron microscope, the scanning electron microscope is configured to observe a process of stripping a defect at the defective position of the whole glass panel of the display panel, and the scanning electron microscope is juxtaposed with the first ion overhaul apparatus.

14. The detecting equipment as claimed in claim 11, wherein the detecting equipment further comprises a scanning electron microscope, and the scanning electron microscope is movably disposed between the first ion overhaul apparatus and the repair apparatus.

15. The detecting equipment as claimed in claim 11, wherein the detecting equipment further comprises two scanning electron microscopes, one of the two scanning electron microscopes is juxtaposed and fixed with the first ion overhaul apparatus, and the other one of the two scanning electron microscopes is juxtaposed and fixed with the repair apparatus.

16. The detecting equipment as claimed in claim 11, wherein the detecting equipment further comprises a repair quality examination apparatus, the repair quality examination apparatus is configured to perform an examination of repair quality on the whole glass panel of the display panel after the cut defective position is repaired, and the repair quality examination apparatus is disposed a downstream position of the repair apparatus.

17. The detecting equipment as claimed in claim 16, wherein the repair quality examination apparatus is a third ion overhaul apparatus.

18. A detecting method, comprising:
inspecting whether a glass panel of a display panel has a defective position by an inspection apparatus;
after acquiring the defective position of the glass panel by the inspecting, using a first focused ion beam generated by an ion overhaul apparatus to cut the defective position of the glass panel, so as to strip a defect at the defective position and observe morphology of defect; and
using a repair apparatus to perform a repair treatment on the defective position to repair the glass panel after the defect is stripped;
wherein the inspection apparatus, the first ion overhaul apparatus and the repair apparatus are sequentially installed on a same production line in that order;
wherein during using the first focused ion beam generated by the ion overhaul apparatus to cut the defective position of the glass panel, so as to strip the defect at the defective position and observe the morphology of defect, the defective position is observed simultaneously by a microscope to judge whether a strip result meets a requirement for subsequent the repair treatment performed by the repair apparatus, while cutting the defective position to strip the defect;
wherein during using the repair apparatus to perform the repair treatment on the defective position to repair the glass panel after the defect is stripped, the defective position is monitored in real-time by the same microscope or another microscope, while performing the repair treatment on the defective position.

* * * * *